(12) United States Patent
Park

(10) Patent No.: US 7,427,456 B2
(45) Date of Patent: Sep. 23, 2008

(54) LAYOUT OF A VERTICAL PATTERN USED IN DIPOLE EXPOSURE APPARATUS

(75) Inventor: Chan Ha Park, Suwon-si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 600 days.

(21) Appl. No.: 10/905,607

(22) Filed: Jan. 12, 2005

(65) Prior Publication Data

US 2006/0063075 A1    Mar. 23, 2006

(30) Foreign Application Priority Data

Sep. 17, 2004    (KR)    ............. 10-2004-0074760

(51) Int. Cl.
*G03F 1/00* (2006.01)
*G03C 5/00* (2006.01)

(52) U.S. Cl. ............................. 430/5; 430/30

(58) Field of Classification Search .......... 430/5, 430/30; 716/19–21

See application file for complete search history.

(56) References Cited

U.S. PATENT DOCUMENTS

| | | | |
|---|---|---|---|
| 6,121,073 A | 9/2000 | Huang et al. | ............ 438/132 |
| 6,307,213 B1 | 10/2001 | Huang et al. | ............ 257/50 |
| 6,553,562 B2 * | 4/2003 | Capodieci et al. | ............ 716/19 |
| 6,613,612 B2 | 9/2003 | Park | ............ 438/132 |
| 6,915,505 B2 * | 7/2005 | Hsu et al. | ............ 716/19 |
| 7,022,438 B2 * | 4/2006 | Kim | ............ 430/5 |
| 2004/0142251 A1 | 7/2004 | Hsu et al. | |

FOREIGN PATENT DOCUMENTS

| | | |
|---|---|---|
| JP | 07-181668 | 7/1995 |
| KR | 1020030038419 | 5/2003 |
| KR | 1020030043443 | 6/2003 |

* cited by examiner

*Primary Examiner*—Stephen Rosasco
(74) *Attorney, Agent, or Firm*—Marshall, Gerstein & Borun LLP

(57) ABSTRACT

A layout of vertical patterns in a mask used in a dipole exposure apparatus employing a dipole as an aperture, including the vertical patterns disposed vertically to the dipole, and tabs, having critical dimensions broader than those of the vertical patterns, crossing edges of the vertical patterns. The tabs having critical dimensions broader than those of the vertical patterns are additionally inserted into the edges of the vertical patterns disposed vertically to the dipole, thereby minimizing the difference in critical dimensions between central and edge portions of the vertical patterns so that the vertical patterns maintain uniform fine critical dimensions.

2 Claims, 8 Drawing Sheets

Layout result of horizontal pattern obtained by exposure

LAYOUT OF A VERTICAL PATTERN USED IN DIPOLE EXPOSURE APPARATUS

FIELD OF THE TECHNOLOGY

The present invention relates to an exposure technique, and more particularly to a layout of vertical patterns used in a dipole exposure apparatus employing a dipole as an aperture to improve the resolution of the vertical patterns.

BACKGROUND

In order to meet high-integration and high-density trends of semiconductor devices, a photolithography technique for forming fine patterns has been researched and developed. Photolithography methods for improving resolution of fine patterns include a method of adjusting a light source (for example, off-axis illumination), a method using a mask employing optical interference (for example, attenuating phase shift and alternating phase shift), and a method of adjusting the layout of a mask (for example, optical proximity effect).

Since high resolution and depth of focus (DOF) are required to remove an ultrahigh integrated element, a modified illumination method, such as off-axis illumination using an aperture, has been actively developed. Apertures, which are generally used in an off-axis illuminating system, include an annular, a quadruple, and a dipole.

In a semiconductor memory element, such as a DRAM or flash memory in which a plurality of unit cells are repeated, the cells have a designated orientation. Accordingly, in case the above semiconductor memory element is formed by an exposure apparatus employing a dipole as an aperture, it is possible to increase the margin in a process. For example, in case that an exposure apparatus having an off-axis illuminating system employing KrF as a light source and a dipole as an aperture is used, it is possible to achieve fine patterns of a semiconductor element having a half pitch less than 100 nm.

FIG. 1 is a schematic view of a conventional exposure apparatus employing a dipole as an aperture.

As shown in FIG. 1, an exposure apparatus employing a dipole as the aperture, to which an off-axis illuminating system is applied, comprises an aperture 10 serving as means for controlling an exposure light source, a condenser lens 12 for collecting light having passed through the aperture 10, a projection lens 16 for condensing the light onto a wafer 18 placed below the condenser lens 12, and a mask 14 placed between the condenser lens 12 and the projection lens 16 and serving as a reticle for patterning photoresist formed on the wafer 18.

In the above exposure apparatus, after the exposure light is filtered and collected by the aperture 10 and the condenser lens 12 and passes through the mask 14, the exposure light is irradiated onto the wafer 18, provided with the photoresist applied thereon, through the projection lens 16. Thereby, semiconductor device patterns formed in the mask 14 are projected on the wafer 18.

During the above exposing process, a zero-order light component and a negative first-order light component of the light having passed through the condenser lens 12 and the mask 14 are condensed onto the projection lens 16 by a diffraction component, and are irradiated onto the photoresist of the wafer 18, thereby being capable of accurately forming fine patterns of the mask 14.

FIG. 2 illustrates the dipole serving as an aperture. As shown in FIG. 2, the dipole has various pole shapes and orientations, for example, in the vertical direction, in the horizontal direction or at any given angle. Here, the vertical and horizontal directions denote orthogonal directions of geometric patterns, formed along Y and X directions respectively, on a plane.

FIGS. 3A and 3B illustrate wafer patterns exposed by horizontal and vertical patterns respectively having the same size in the mask of the dipole exposure apparatus of FIG. 2 employing the dipole, to which the off-axis illuminating system is applied. A wafer pattern 26, which is made by exposure of a pattern 24 vertical to the dipole, has a resolution higher than that of a wafer pattern 22, which is exposed by a pattern 20 horizontal with the dipole. Accordingly, the horizontal wafer pattern 22 of FIG. 3A has a broad critical dimension, and the vertical wafer pattern 26 of FIG. 3B has a narrow critical dimension.

Differing from FIG. 2, in the case of an illuminating system having poles, through which a laser passes, placed at upper and lower portions thereof is applied to a dipole exposure apparatus as shown in FIG. 4, vertical patterns 32 are laid across a boundary region between an active region 30 and a device isolation region 34 of a semiconductor device formed on a wafer. When the sizes of the vertical patterns 32 are maintained to have small critical dimensions so as to reach the limit of the resolution, the profiles of the vertical patterns 32 are severely deformed at an edge portion (A) of the boundary region, and the critical dimension of the vertical patterns 32 at the edge portion (A) is narrower than the critical dimension of the vertical patterns 32 at a central portion (B).

The above dipole exposure apparatus employing the dipole cannot achieve the fine critical dimension of the vertical patterns, thereby causing the deterioration of yield of semiconductor devices.

SUMMARY

In one aspect, the invention is directed to a layout of vertical patterns in a mask used in a dipole exposure apparatus employing a dipole as an aperture, which may include the vertical patterns disposed vertically to the dipole, and tabs, having critical dimensions broader than those of the vertical patterns, crossing edges of the vertical patterns.

The tabs may be formed at the edges of the vertical patterns placed at a boundary region between an active region and a device isolation region in the mask, and may have critical dimensions broader than those of the vertical patterns by 5 nm~10 nm.

Further, the dipole exposure apparatus may use KrF, ArF, or F2 as an exposure light source.

DETAILED DESCRIPTION

Figure 5:
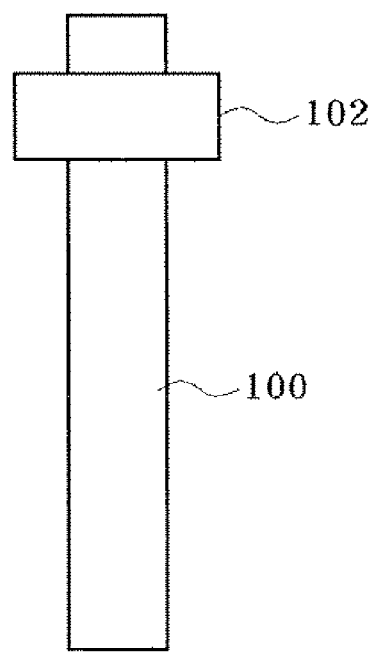
FIG. 5 is a schematic view illustrating a layout of a vertical pattern, into which a tab is additionally inserted, in a mask of a dipole exposure apparatus.

FIG. 5 illustrates a layout of a vertical pattern, into which a tab is inserted, in a mask of a dipole exposure apparatus.

As shown in FIG. 5, a tab 102 is additionally inserted into an edge of a pattern 100, which is vertical to a dipole, out of patterns in a mask of the exposure apparatus employing the dipole as an aperture, thereby minimizing a difference of critical dimensions between a central portion and an edge portion of the vertical pattern 100 irradiated onto a photoresist on a wafer in an exposure step. Here, the tab 102 has a critical dimension broader than that of the vertical pattern 100, and the tab 102 and the vertical pattern 100 cross each other.

The width of the tab 102, which is inserted into the edge of the vertical pattern 100 in the mask, is broader than that of the vertical pattern 100 by 5 nm~10 nm.

Figure 1:
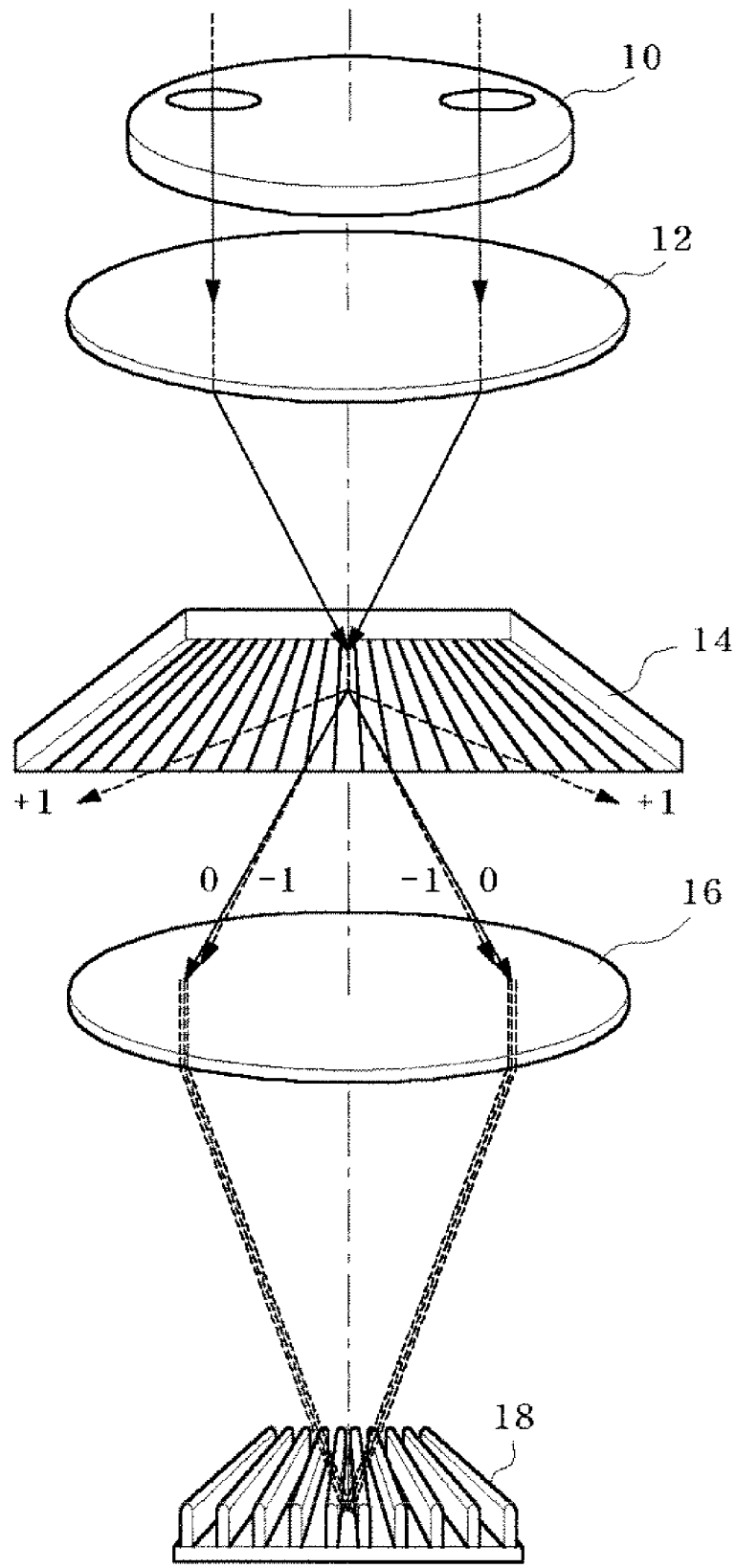
FIG. 1 is a schematic view of a conventional exposure apparatus employing a dipole as an aperture.
Figure 2:
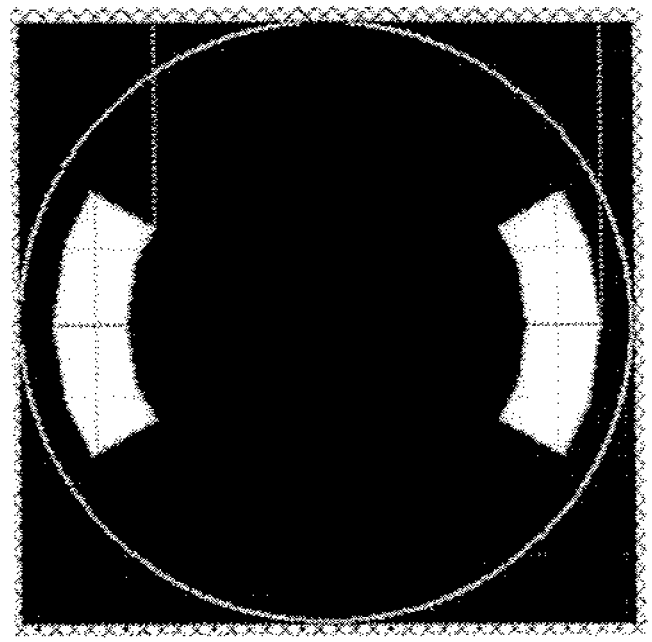
FIG. 2 is an enlarged view illustrating the dipole.
Figure 3A:
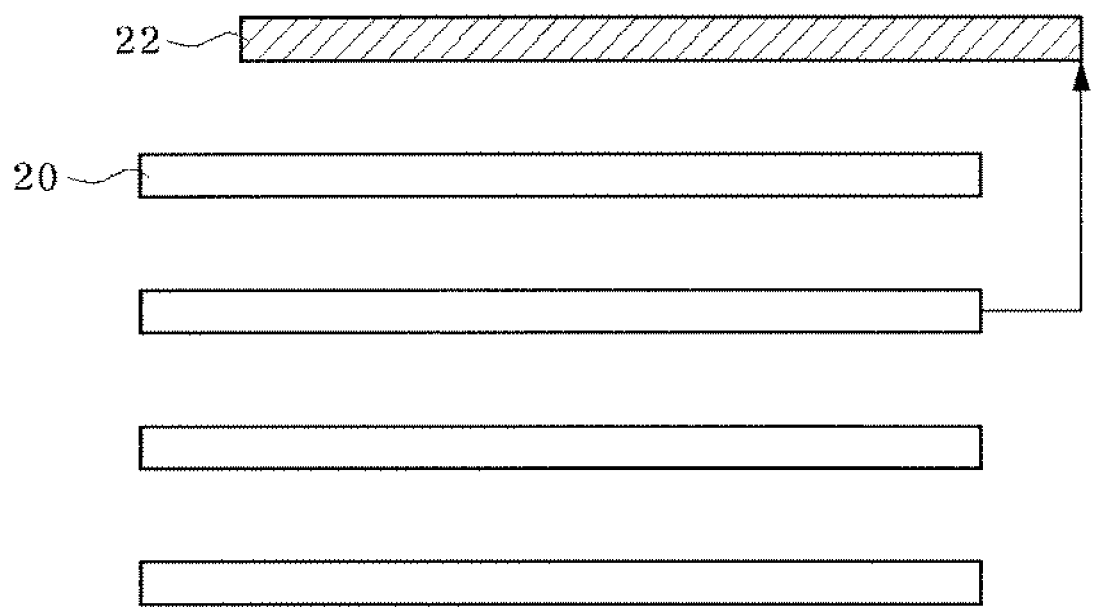
FIGS. 3A and 3B are schematic views illustrating wafer patterns exposed by horizontal and vertical patterns respectively having the same size in a mask of the dipole exposure apparatus.
Figure 3B:
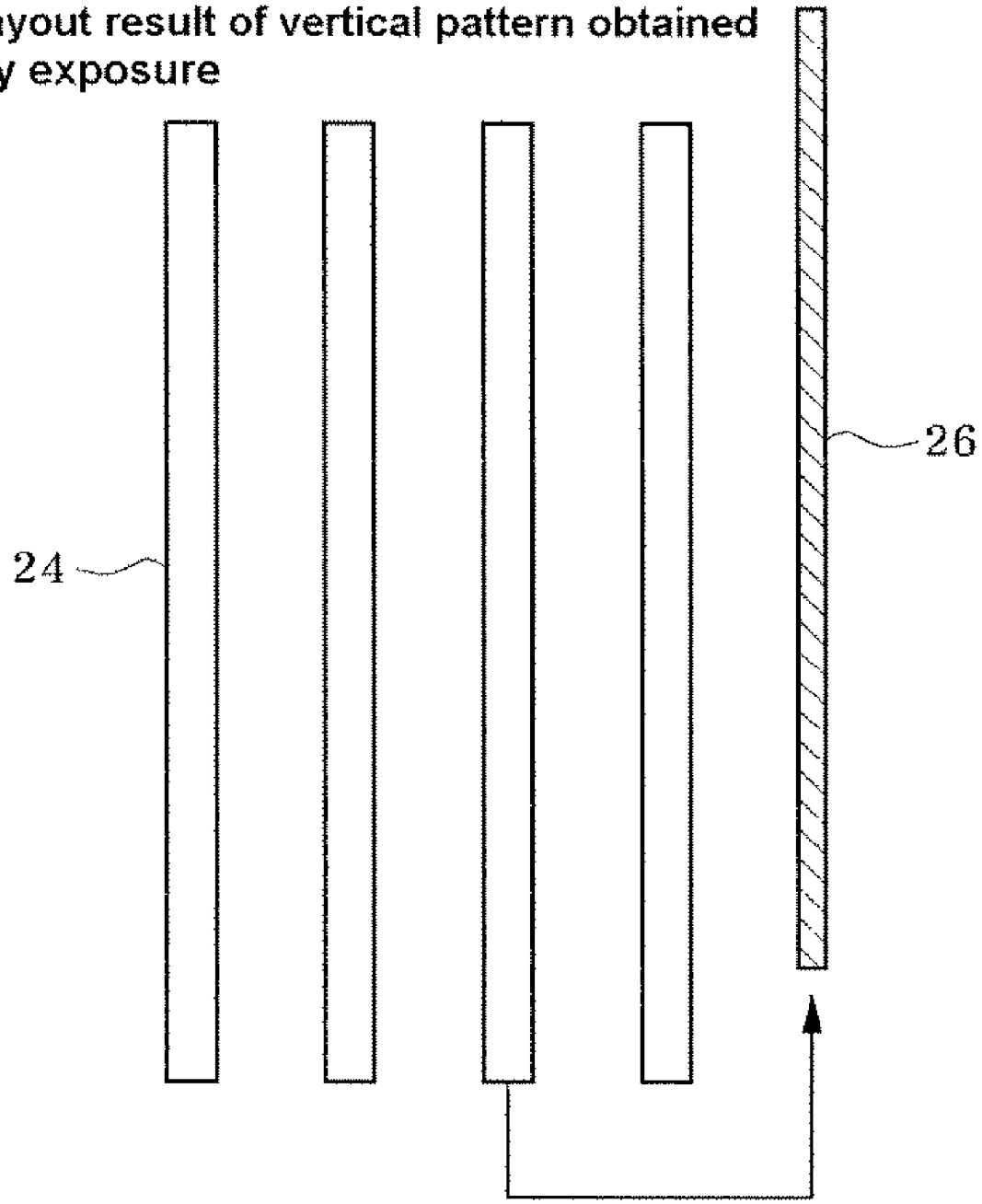
Figure 4:
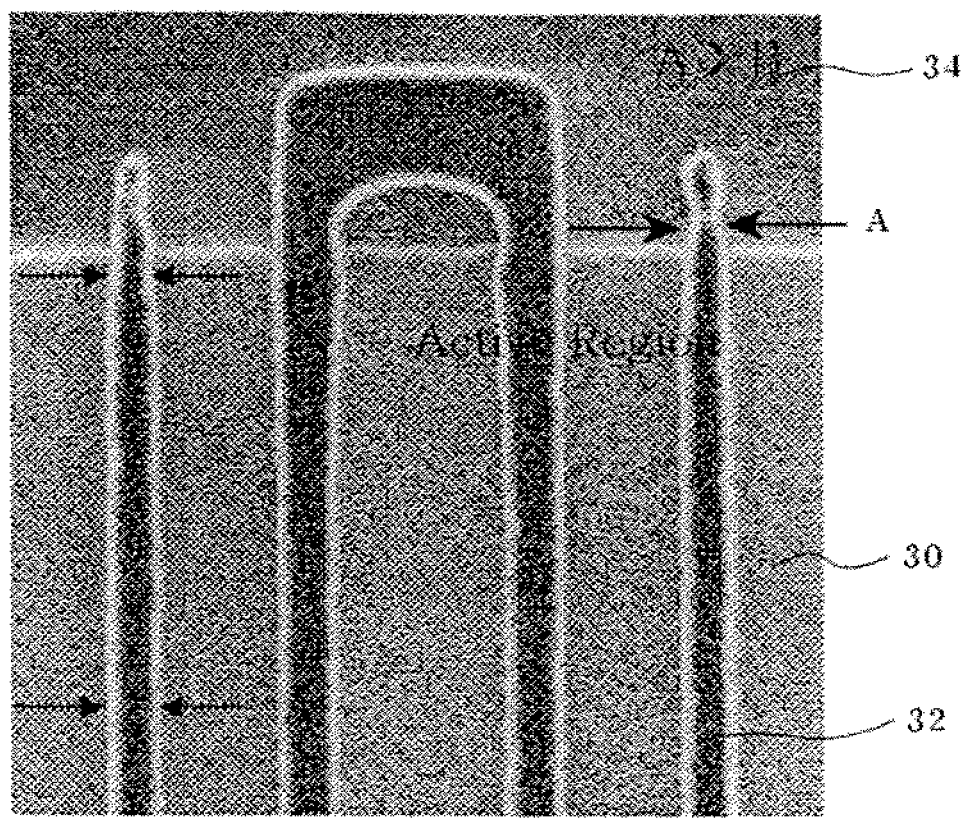
FIG. 4 is a schematic view illustrating wafer patterns exposed by vertical patterns in a mask of another conventional dipole exposure apparatus.

With reference to FIG. 1, the dipole exposure apparatus comprises the aperture 10 for controlling an exposure light source, the condenser lens 12 for collecting the light having passed through the aperture 10, the projection lens 16 for condensing the light onto the wafer 18 placed below the condenser lens 12, and the mask 14 placed between the condenser lens 12 and the projection lens 16 and serving as a reticle for patterning photoresist formed on the wafer 18. As shown in FIG. 5, the vertical patterns 100 provided with edges, into which the tabs 102 are inserted, are formed in the mask 14 of the dipole exposure apparatus. The dipole exposure apparatus uses KrF, ArF, or F2 as the exposure light source so as to achieve a high resolution.

In the above-described dipole exposure apparatus, the exposure light source, such as KrF, is filtered and collected by the aperture 10 and the condenser lens 12, passes through the vertical patterns 100, into which the tabs 102 are inserted, in the mask 14, and then is irradiated onto the wafer 18 provided with the photoresist applied thereon through the projection lens 15. Then, the vertical patterns 100, into which the tabs 102 are inserted, formed in the mask 14 are projected on the wafer 18. Accordingly, the deterioration of the resolution generated from the edges of the vertical patterns 100 is compensated for by the tabs 102.

Figure 6A:
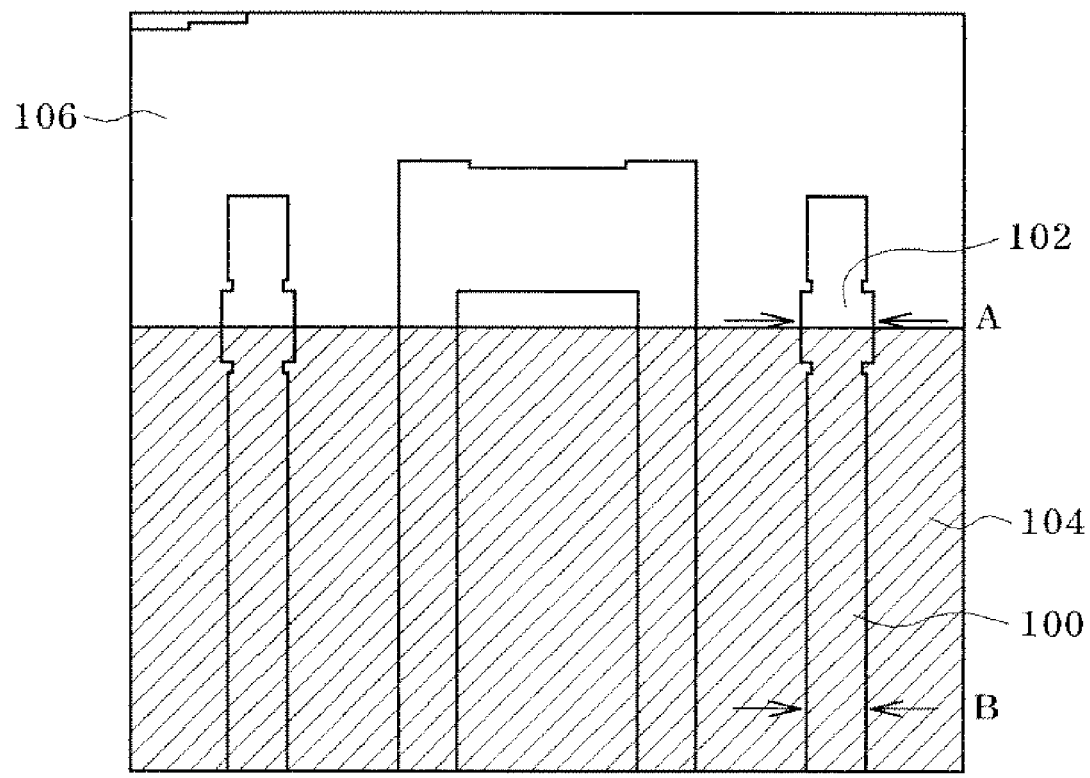
FIGS. 6A to 6C are side views illustrating various examples of vertical patterns, into which tabs are inserted, in a mask of a dipole exposure apparatus.
Figure 6B:
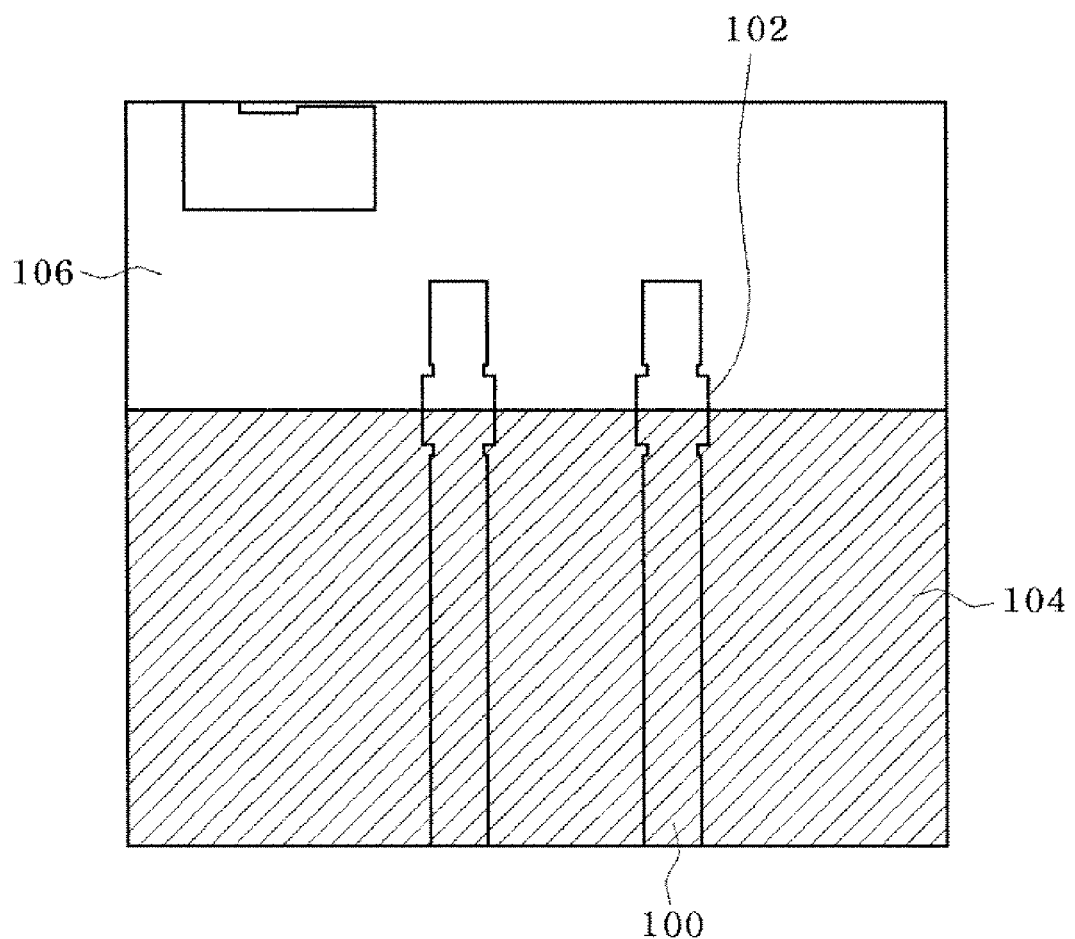
Figure 6C:
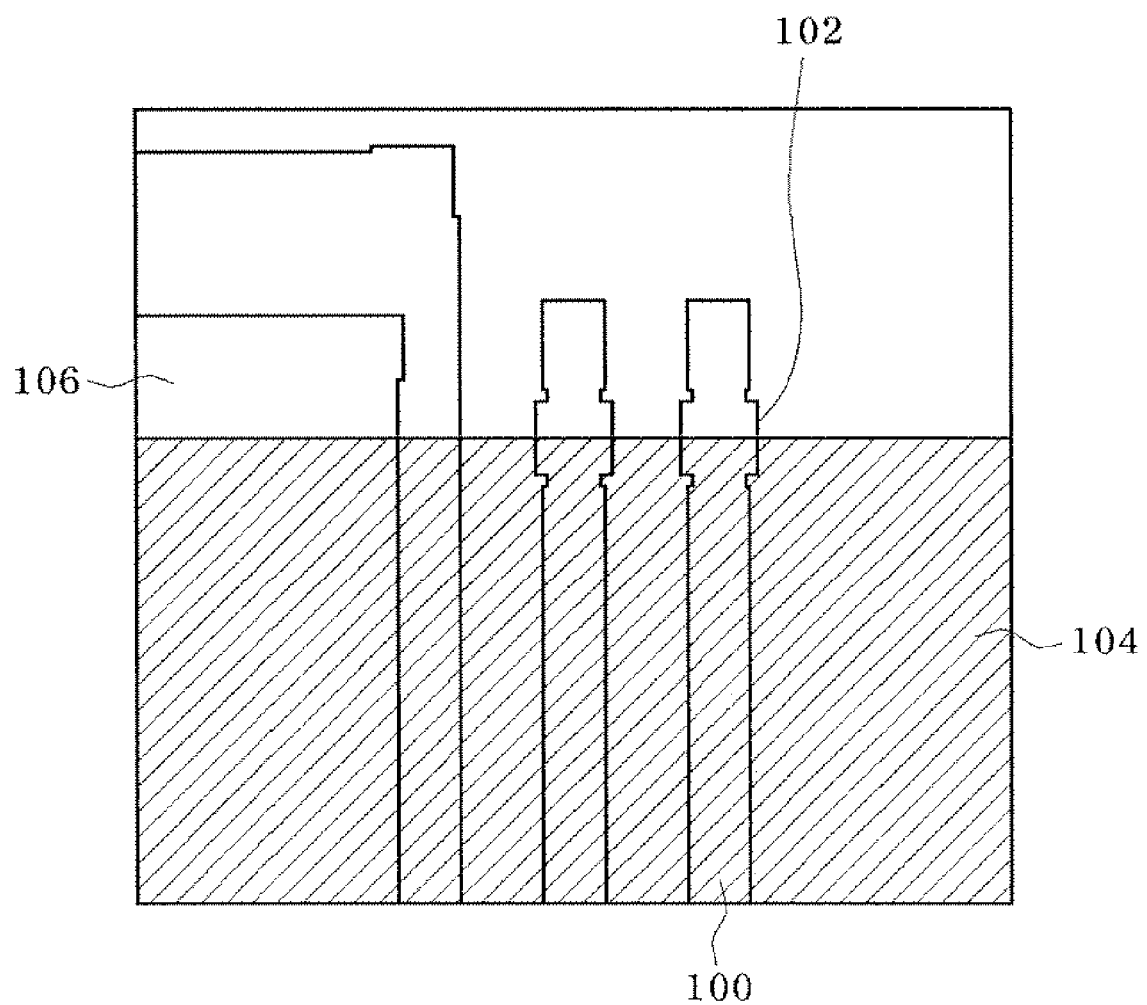

FIGS. 6A to 6C respectively illustrate various examples of vertical patterns, into which tabs are inserted, formed in the mask of the dipole exposure apparatus.

With reference to FIGS. 6A, 6B, and 6C, the tabs 102 having broad critical dimensions are respectively inserted into edges A of the vertical patterns 100 placed at a boundary region between an active region 104 and a device isolation region 106. Here, a reference character B denotes all portions of the vertical patterns 100 except for the edges A, and preferably denotes the centers of the vertical patterns 100 in opposite to the edges A of the vertical patterns 100.

Generally, in the exposure apparatus employing a dipole as an aperture, to which an off-axis illuminating system is applied, the profiles of the vertical patterns, which are laid across a boundary region between an active region and a device isolation region of a semiconductor device, are severely deformed at the edges thereof in the boundary region. Accordingly, in order to prevent the above problem, as shown in FIGS. 6A to 6C, the tabs 102 are inserted into the edges of the vertical patterns 100 placed at the boundary region between the active region 104 and the inactive region 106.

Figure 7A:
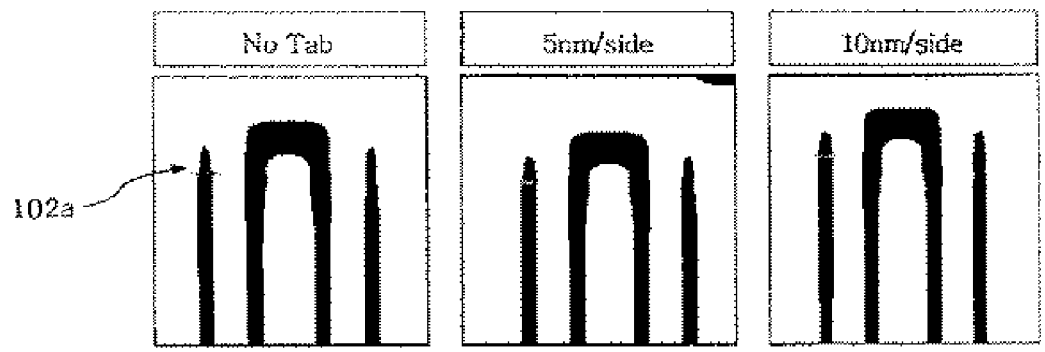
FIGS. 7A to 7C are graphs comparing wafer patterns obtained by exposing vertical patterns without tabs and vertical patterns with tabs respectively in the dipole exposure apparatus.
Figure 7B:
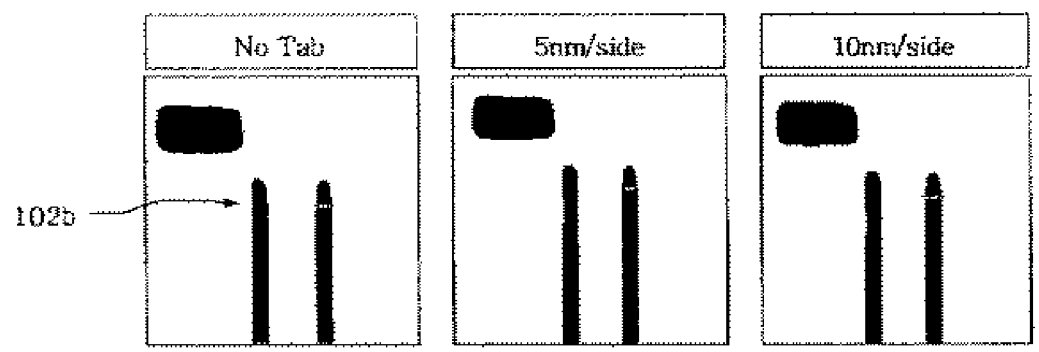
Figure 7C:
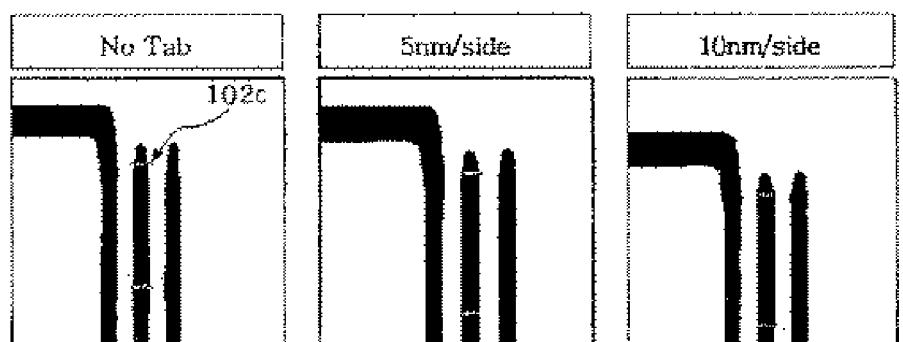

FIGS. 7A to 7C are graphs comparing wafer patterns obtained by exposing vertical patterns without tabs and vertical patterns with tabs in the dipole exposure apparatus.

Here, the dipole exposure apparatus has exposure conditions in which KrF of 0.8 NA and a dipole of 70Y are used.

TABLE 1

|  | Prior Art (without tab) | Present invention (with tab having critical dimension broader than that of vertical pattern by 5 nm) | Present invention (with tab having critical dimension broader than that of vertical pattern by 10 nm) |
| --- | --- | --- | --- |
| 102a center | 113.6 | 113.6 | 113.6 |
| 102a edge | 98.0 | 112.1 | 123.0 |
| 102b center | 143.6 | 143.6 | 143.6 |
| 102b edge | 129.3 | 139.0 | 148.6 |
| 102c center | 161.1 | 161.1 | 160.9 |
| 102c edge | 127.4 | 151.7 | 175.6 |

With reference to the graphs of FIGS. 7A, 7B, and 7C, in case that tabs are not inserted into vertical patterns of the conventional dipole exposure apparatus, wafer patterns 102a, 102b, and 102c are obtained on the photoresist on a wafer by exposure such that the edges of the wafer patterns 102a, 102b, and 102c have critical dimensions (for example, 98.0, 129.3, and 127.4) narrower than the critical dimensions (for example, 113.6, 143.6, and 161.1) of the centers of the wafer patterns 102a, 102b, and 102c.

Further, with reference to middle graphs of FIGS. 7A, 7B, and 7C, in case tabs having critical dimensions broader than those of vertical patterns by 5 nm are inserted into edges of the vertical patterns of the dipole exposure apparatus of the present invention, wafer patterns 102a, 102b, and 102c are obtained on the photoresist on a wafer by exposure such that the edges of the wafer patterns 102a, 102b, and 102c have critical dimensions (for example, 112.1, 139.0, and 151.7) similar to the critical dimensions (for example, 113.6, 143.6, and 161.1) of the centers of the wafer patterns 102a, 102b, and 102c.

Further, with reference to right graphs of FIGS. 7A, 7B, and 7C, in case tabs having critical dimensions broader those of vertical patterns by 10 nm are inserted into edges of the vertical patterns of the dipole exposure apparatus, wafer patterns 102a, 102b, and 102c are obtained on the photoresist on a wafer by exposure such that the edges of the wafer patterns 102a, 102b, and 102c have critical dimensions (for example, 123.0, 148.6, and 175.6) similar to the critical dimensions (for example, 113.6, 143.6, and 161.1) of the centers of the wafer patterns 102a, 102b, and 102c.

Consequently, in case tabs are not inserted into the edges of the vertical patterns of the conventional dipole exposure apparatus, the edges of the wafer patterns formed on the photoresist of the wafer have critical dimensions differing from those of the centers of the wafer patterns. On the other hand, in case tabs having critical dimensions broader than those of vertical patterns by 5 nm or 10 nm are inserted into edges of the vertical patterns of the dipole exposure apparatus, the edges of the wafer patterns formed on the photoresist of the wafer have critical dimensions approximately the same as those of the centers of the wafer patterns.

Accordingly, in case that the tabs having critical dimensions broader than those of the vertical patterns are inserted into the edges of the vertical patterns of the dipole exposure apparatus, it is possible to minimize the difference between critical dimensions between the centers and the edges of the wafer patterns formed on the wafer, thereby achieving uniform fine critical dimensions of the vertical patterns. In other words, in the layout of the vertical patterns, the tabs, having critical dimensions broader than those of the vertical patterns, may be inserted into edges of the vertical patterns disposed vertically to the dipole, thereby minimizing a difference of critical dimensions between central and edge portions of the vertical patterns so that the vertical patterns maintain uniform fine critical dimensions.

As apparent from the above description, this disclosure provides a layout of vertical patterns in a mask used in a dipole exposure apparatus employing a dipole as an aperture, which comprises the vertical patterns disposed vertically to the dipole, and tabs, having critical dimensions broader than those of the vertical patterns, inserted into the edges of the vertical patterns, thereby minimizing the difference in critical dimensions between central and edge portions of the vertical patterns so that the vertical patterns maintain uniform fine critical dimensions.

Further, in case the layout of the vertical patterns is applied to a gate line, a channel length of the gate line is uniformly maintained even at a boundary region between an active region and a device isolation region, thereby allowing a transistor to be accurately turned on/off.

Although certain examples of methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed as new and desired to be protected by Letters Patent of the United States is:

1. A layout of vertical patterns in a mask used in a dipole exposure apparatus employing a dipole as an aperture, comprising:
    the vertical patterns disposed vertically to the dipole, in which one of the vertical patterns is positioned on an active region and extends across a boundary region between the active region and an inactive region in the mask, to have an end portion terminated in the inactive region; and
    tabs, having a critical dimension broader than those of the vertical patterns by 5 nm~10 nm, crossing edges of the vertical patterns,
    wherein the tabs are formed at the edges of the vertical patterns placed at the boundary region between the active region and the inactive region in the mask, and
    wherein the tabs compensate a deterioration of an exposure resolution generated from the edges of the vertical patterns placed at the boundary region when the vertical patterns are transferred to a wafer by the exposure apparatus, so that a difference between a first critical dimension of an edge portion of the vertical pattern placed at the boundary region and a second critical dimension of a center portion of the vertical pattern is reduced.
2. The layout according to claim 1,
    wherein the dipole exposure apparatus uses one or more of the following as an exposure light source: KrF, ArF, or F2.

* * * * *